United States Patent
Reisman et al.

(10) Patent No.: US 8,774,482 B2
(45) Date of Patent: Jul. 8, 2014

(54) GENERATING PSEUDO-CT IMAGE VOLUMES FROM ULTRA-SHORT ECHO TIME MR

(75) Inventors: James G. Reisman, Princeton, NJ (US); Christophe Chefd'hotel, Jersey City, NJ (US)

(73) Assignee: Siemens Aktiengesellschaft, Munich (DE)

( * ) Notice: Subject to any disclaimer, the term of this patent is extended or adjusted under 35 U.S.C. 154(b) by 523 days.

(21) Appl. No.: 13/109,159

(22) Filed: May 17, 2011

(65) Prior Publication Data

US 2011/0286649 A1  Nov. 24, 2011

Related U.S. Application Data

(60) Provisional application No. 61/346,508, filed on May 20, 2010.

(51) Int. Cl.
- *G06K 9/00* (2006.01)
- *G01R 33/48* (2006.01)
- *G06T 7/00* (2006.01)

(52) U.S. Cl.
CPC .......... *G06T 7/0028* (2013.01); *G01R 33/4812* (2013.01); *G01R 33/481* (2013.01); *G06T 7/0081* (2013.01); *G01R 33/4816* (2013.01); *G06T 2207/10088* (2013.01); *G06T 2207/30008* (2013.01)
USPC .......................................... 382/131; 132/128

(58) Field of Classification Search
None
See application file for complete search history.

(56) References Cited

U.S. PATENT DOCUMENTS

| | | | |
|---|---|---|---|
| 5,594,807 A * | 1/1997 | Liu ............................... | 382/128 |
| 6,081,612 A * | 6/2000 | Gutkowicz-Krusin et al. ............................. | 382/128 |
| 6,584,216 B1 * | 6/2003 | Nyul et al. ..................... | 382/131 |
| 8,290,248 B2 * | 10/2012 | Yea et al. ...................... | 382/154 |
| 2003/0053668 A1 * | 3/2003 | Ditt et al. ....................... | 382/128 |
| 2003/0228042 A1 * | 12/2003 | Sinha ............................ | 382/131 |
| 2004/0071325 A1 * | 4/2004 | Joseph Declerck et al. .. | 382/128 |
| 2004/0170308 A1 * | 9/2004 | Belykh et al. ................. | 382/128 |
| 2006/0110021 A1 * | 5/2006 | Luo et al. ...................... | 382/132 |
| 2008/0132774 A1 * | 6/2008 | Milstein et al. ............... | 600/407 |
| 2012/0288181 A1 * | 11/2012 | Milstein et al. ............... | 382/134 |

OTHER PUBLICATIONS

Boettger et al ("Radiation therapy planning and simulation with magnetic resonance images", Medical Imaging 2008).*

Hofmann et al ("MRI Based attenuation correction for PET/MRI: A novel approach combining pattern recognition and atlas registration", 2008).*

* cited by examiner

*Primary Examiner* — Avinash J Yentrapati

(57) ABSTRACT

A method for generating a pseudo-computed tomography (CT) image volume includes acquiring a first magnetic resonance (MR) image volume (UTE1) using an ultra-short echo time and acquiring a second MR image volume (UTE2) using a conventional echo time that is longer than the ultra-short echo time. The acquired UTE1 and UTE2 image volumes are normalized. A mask for an anatomical structure featured in the normalized UTE1 and UTE2 image volumes is created and bone regions are segmented from the normalized UTE1 and UTE2 image volumes using the created mask and one or more trained classifiers. A pseudo-CT image is constructed from the normalized UTE1 and UTE2 image volumes, the created mask, and the segmented bone regions.

20 Claims, 4 Drawing Sheets

GENERATING PSEUDO-CT IMAGE VOLUMES FROM ULTRA-SHORT ECHO TIME MR

CROSS-REFERENCE TO RELATED APPLICATION

The present application is based on provisional application Ser. No. 61/346,508, filed May 20, 2010, the entire contents of which are herein incorporated by reference.

BACKGROUND OF THE INVENTION

1. Technical Field

The present disclosure relates to ultra-short echo time magnetic resonance (MR) and, more specifically, to generating pseudo-computer tomography (CT) volumes from ultra-short echo time MR.

2. Discussion of Related Art

Positron emission tomography—computed tomography (PET-CT) is a medical imaging technique in which medical images from both Positron Emission Tomography (PET) and an x-ray Computed Tomography (CT) are combined to form a co-registered image. By combining these two modalities, resulting medical images may include the detailed structure of the CT with the functional imaging of the PET, which depicts spatial distribution of metabolic or biochemical activity in the body.

PET-CT has uses in diagnosis, surgical planning, and administration of radiation therapy. PET-CT may be particularly useful for imaging the head of a patient subject. However, while PET-CT has many benefits over alternative imaging modalities, the use of x-ray CT exposes the patient to doses of ionizing radiation that are potentially harmful to patients.

SUMMARY

A method for generating a pseudo-computed tomography (CT) image volume includes acquiring a first magnetic resonance (MR) image volume (UTE1) using an ultra-short echo time. A second MR image volume (UTE2) is acquired using a conventional echo time that is longer than the ultra-short echo time. The acquired UTE1 and UTE2 image volumes are normalized. A mask for an anatomical structure featured in the normalized UTE1 and UTE2 image volumes is created. Bone regions are segmented from the normalized UTE1 and UTE2 image volumes using the created mask and one or more trained classifiers. A pseudo-CT image is constructed from the normalized UTE1 and UTE2 image volumes, the created mask, and the segmented bone regions.

The anatomical structure may be a head. The first MR image volume UTE1 and the second MR image volume UTE2 may be acquired using a single UTE MR protocol. The acquired UTE1 and UTE2 image volumes may be normalized to standardize intensity spreads between a main background region and a foreground region. Normalization of the acquired UTE1 and UTE2 image volumes may include histogramming the UTE1 and UTE2 image volumes and identifying a first intensity value at a first major peak attributable to a background region and a second intensity value attributable a second major peak attributable to a foreground region and performing linear remapping on the UTE1 and UTE2 images to normalize the first and second intensity values.

Creating the mask of the anatomical structure may include thresholding the normalized UTE1 and UTE2 image volumes, using morphological methods to remove noise due to stray intensity patches, applying a morphological closing operation to remove small gaps, and performing region labeling to detect small unconnected regions which are then labeled as background.

The one or more trained classifiers may use features based on one or more of the following: a difference between the normalized UTE1 and UTE2 image volumes, a first localization map proving voxel distance inward from an outer surface of the anatomical structure, and a second localization map providing voxel distance downward from a top plane of the anatomical structure.

The one or more trained classifiers may be trained using training data including: UTE1 image volumes, UTE2 image volumes, and corresponding CT scans that have been registered to serve as ground truth. Training the trained classifiers may include normalizing the UTE1 and UTE2 image volumes and extracting classifier features.

Extracting classifier features may include calculating a difference between the normalized UTE1 and UTE image volumes, generating a first localization map providing voxel distance inward from an outer surface of the anatomical structure, and generating a second localization map providing voxel distance downward from a top plane of the anatomical structure. Constructing the pseudo-CT image may include assigning appropriate Hounsfield scale values based on the anatomical map and the segmented bone regions.

The method may additionally include acquiring a positron emission tomography (PET) scan, generating an approximate attenuation correction (AC) map based on the constructed pseudo-CT image, and calibrating an intensity of the PET result using the generated AC map.

A method for generating a pseudo-computed tomography (CT) image volume includes acquiring a set of training data including a first magnetic resonance (MR) image volume (UTE1) acquired using an ultra-short echo time, a second MR image volume (UTE2) acquired using a conventional echo time that is longer than the ultra-short echo time, and corresponding reference CT images. The UTE1 and UTE2 images of the training data are normalized. One or more features are extracted from the normalized UTE1 and UTE2 images of the training data. One or more classifiers are trained based on the normalized UTE1 and UTE2 images of the training data and the one or more extracted features. Test case data including UTE1 and UTE2 images are acquired. The acquired UTE1 and UTE2 images of the test case data are normalized. A mask is created for an anatomical structure featured in the normalized UTE1 and UTE2 images of the test case data. Bone regions are segmented from the normalized UTE1 and UTE2 images of the test case data using the created mask and one or more trained classifiers. A pseudo-CT image is constructed from the normalized UTE1 and UTE2 images of the test case data, the created mask, and the segmented bone regions.

Normalization of the acquired UTE1 and UTE2 image volumes of the training data and the test data may include histogramming the UTE1 and UTE2 image volumes and identifying a first intensity value at a first major peak attributable to a background region and a second intensity value attributable a second major peak attributable to a foreground region and performing linear remapping on the UTE1 and UTE2 images to normalize the first and second intensity values.

The features extracted from the normalized UTE1 and UTE2 images of the training data may be based on one or more of the following: a difference between the normalized UTE1 and UTE2 images of the training data, a first localization map proving voxel distance inward from an outer surface of the anatomical structure, and a second localization map providing voxel distance downward from a top plane of the anatomical structure.

A method for generating a pseudo-computed tomography (CT) image volume includes acquiring a first magnetic resonance (MR) image volume (UTE1) of a head using an ultra-short echo time. A second MR image volume (UTE2) of the head is acquired using a conventional echo time that is longer than the ultra-short echo time. The acquired UTE1 and UTE2 image volumes are normalized. A head mask is created from the normalized UTE1 and UTE2 image volumes. Bone regions are segmented from the normalized UTE1 and UTE2 image volumes using the created head mask and one or more trained classifiers. A pseudo-CT image is constructed from the normalized UTE1 and UTE2 image volumes, the created mask, and the segmented bone regions.

Constructing the pseudo-CT image may include assigning a first Hounsfield scale value to the segmented bone regions, assigning a second Hounsfield scale value to air regions determined using the head map, and assigning a third Hounsfield scale value to brain regions determined using the normalized UTE2 image volume.

A computer system includes a processor and a non-transitory, tangible, program storage medium, readable by the computer system, embodying a program of instructions executable by the processor to perform method steps for generating a medical image, the method includes acquiring a first magnetic resonance (MR) image volume (UTE1) using an ultra-short echo time. A second MR image volume (UTE2) is acquired using a conventional echo time that is longer than the ultra-short echo time. The acquired UTE1 and UTE2 image volumes are normalized. Bone regions are segmented from the normalized UTE1 and UTE2 image volumes and one or more trained classifiers. A pseudo-CT image is constructed by assigning appropriate Hounsfield scale values based on the normalized UTE1 and UTE2 image volumes and segmented bone regions.

The anatomical structure is a head and the method may further include creating a head mask from the normalized UTE1 and UTE2 image volumes and using the generated head mask in segmenting the bone region and constructing the pseudo-CT image.

The one or more trained classifiers may be trained using training data including UTE1 image volumes, UTE2 image volumes, and corresponding CT scans that have been registered to serve as ground truth and features based on one or more of the following: a difference between the normalized UTE1 and UTE2 image volumes, a first localization map proving voxel distance inward from an outer surface of the anatomical structure, and a second localization map providing voxel distance downward from a top plane of the anatomical structure.

BRIEF DESCRIPTION OF THE DRAWINGS

A more complete appreciation of the present disclosure and many of the attendant aspects thereof will be readily obtained as the same becomes better understood by reference to the following detailed description when considered in connection with the accompanying drawings, wherein.

DETAILED DESCRIPTION OF THE DRAWINGS

Figure 1:
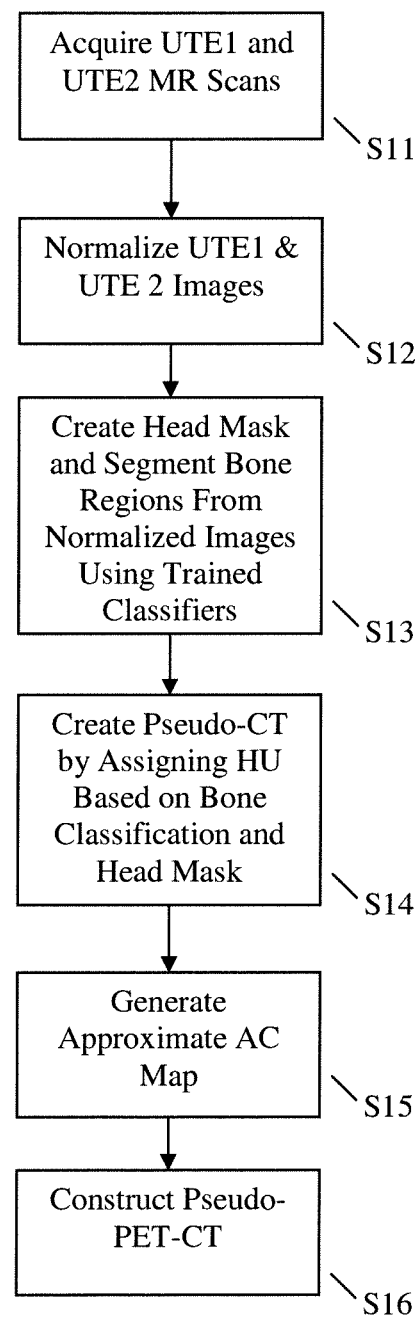
FIG. 1 is a flow chart illustrating principal steps in generating an approximate AC map from MR image data in accordance with exemplary embodiments of the present invention.

In describing exemplary embodiments of the present disclosure illustrated in the drawings, specific terminology is employed for sake of clarity. However, the present disclosure is not intended to be limited to the specific terminology so selected, and it is to be understood that each specific element includes all technical equivalents which operate in a similar manner.

Exemplary embodiments of the present invention seek to achieve medical images with characteristics similar to those obtained using PET-CT without the use of x-ray CT. These images may be referred to herein as pseudo-PET-CT images. These images may be obtained, for example, by co-registration of PET imagery with pseudo-CT image volumes that are generated using magnetic resonance (MR) imaging techniques. However, exemplary embodiments of the present invention are not limited to the generation of pseudo-PET-CT images. Generation of pseudo-CT images may itself be a useful endeavor and accordingly, exemplary embodiments of the present invention may relate to the generation of pseudo-CT images using MR imaging techniques.

CT imaging may be particularly capable of obtaining electron density information of a high quality and resolution. In PET-CT, the obtained electron density information from the CT modality may be used to generate an attenuation correction (AC) maps that may then be used to calibrate the intensity of the PET modality results by utilizing density information of the anatomy along the path from the source of emissions of a PET tracer to the PET detectors.

Exemplary embodiments of the present invention seek to utilize MR imagery to obtain electron density information to generate AC maps that may be used to calibrate the intensity of PET results. However, MR imagery often has difficulty resolving tissue such as bone regions and accordingly, electron density information of bone tissue might be difficult to acquire using MR. Thus, exemplary embodiments of the present invention may utilize ultra-short echo time (UTE) MR modalities, which may be better suited than traditional MR modalities with longer echo times at providing image information pertaining to various tissue such as bone regions.

However, as UTE MR image data may not provide adequate image sharpness to clearly define anatomic boundaries, exemplary embodiments of the present invention may utilize UTE MR in combination with conventional longer echo time MR scans to deduce the location of bone regions, which can then be used to generate accurate AC maps that may be used to calibrate the intensity of the PET in a manner similar to that of CT-PET.

Exemplary embodiments of the present invention may be used to generate an approximate AC map from a pair of MR scans, the first MR scan being a UTE scan (UTE1), and the second MR scan having a conventional echo time (UTE2). As both the first and second MR scan may be acquired under a UTE image acquisition protocol, both scans may be referred to herein as UTE scans, even though it is only the first MR scan that has an ultra-short echo time. The first MR scan may utilize an ultra-short echo time within the range of 0 to 100 ms, including echo times in the microsecond range. Ultra-short echo times used may be, for example, within the range of 10 to 80 ms, for example, within the range of 20 to 60 ms.

FIG. 1 is a flow chart illustrating principal steps in generating an approximate AC map from MR image data in accordance with exemplary embodiments of the present invention. First, a patient may be scanned using UTE protocols to acquire first image data UTE1 and second image data UTE2 (Step S11). As discussed above, the first image data UTE1 may be acquired using an ultra-short echo time while the second image data UTE2 may be acquired using a conventional MR echo time. Alternatively, the order of the image acquisition may be reversed or both images may be acquired at substantially the same time. Next, data intensities of the UTE1 and UTE2 images may be normalized (Step S12). Normalization may be performed using any known technique; however, exemplary embodiments of the present invention may utilize a technique for normalization discussed in detail below.

After the images have been normalized, bone regions may be segmented from the images using one or more trained classifiers (Step S13). The classifiers used may be trained, for example, on UTE1/UTE2 image data that has been segmented against CT scans in which the exact location of the bone regions within the UTE1/UTE2 data may be known by reference to the CT image. A pseudo-CT scan may then be created based on the bone segmentation and identification of air and tissue regions within the UTE1/UTE2 image data (Step S14). Soft tissue regions may be identified directly from the UTE1/UTE2 image data, however, the segmentation of the bone regions using the trained classifiers may be used to differentiate between air regions and bone regions, which may otherwise appear to be similar in conventional MR images. By identifying the precise locations and boundaries of bone, air and tissue within the image data, the pseudo-CT scan may be created.

An approximate AC map may then be generated from the pseudo-CT image in a manner similar to conventional approaches for generating AC maps from actual CT images (Step S15). Then, the approximated AC map may be used to calibrate an intensity of a PET result (Step S16), for example, by using density information of the anatomy along the path from the source of emissions of the PET tracer to the PET detectors. However, as described above, generation of the pseudo-CT image may have uses other than use in conjunction with PET and accordingly, steps S15 and S16 may be optionally omitted.

Additional detail will now be provided pertaining to each of the above steps. With respect to the step of acquiring the first and second image data UTE1 and UTE2, both image acquisition steps may be included as part of a single UTE protocol. This protocol may provide for both an ultra-short echo time image acquisition step and an image acquisition step having a conventional echo time. The protocol may include additional image acquisition steps such as additional ultra-short echo time image acquisitions, e.g. a first image with a first ultra-short echo time, a second image with a second ultra-short echo time different than the first, and a third image with a conventional echo time. Other arrangements may be performed as well.

Due to small variations in protocol, scanner, and patient loading, etc., it is possible to have significant variation in the intensity values of MR image volumes. Accordingly, exemplary embodiments of the present invention may utilize a UTE normalization step to limit the effect of these intensity variations may have on bone classification.

Normalization is the process of bringing the acquired UTE images into a range of intensities that can be consistent across multiple images acquired using diverse scanning hardware, patients, and overall image acquisition conditions. By providing images with consistent intensity profiles, the bone segmentation classifiers may be made more effective by ensuring that the acquired UTE images are sufficiently similar in character to the images used to train the bone detection classifiers. Normalization of the acquired images may be performed in accordance with any number of possible techniques. For example, a particularly simple approach for image normalization would be to calculate the average pixel intensity of the acquired image, compare it to a desired average pixel intensity, determine a correction value that can be multiplied to the average pixel intensity value of the acquired image to bring that value to the level of the desired average pixel value, and then multiply the intensity of each pixel of the acquired image by the determined correction value to produce the normalized image.

However, exemplary embodiments of the present invention may instead use a histogram normalization technique to normalize the acquired UTE images. According to one such approach, where the acquired image is of a subject's head, it may be understood that the head region consists of a very large background region (e.g. air) of a relatively low voxel intensity, a middle region consisting of muscle or other tissue, and a high intensity region consisting of the brain. The goal of histogram normalization, in this case, would be to standardize the intensity spread between the main background region and the brain region. By histogramming the voxels in the UTE MR volume, a first major peak (e.g. from background contribution) may be collected. Then, a second intensity value occurring where a given highest percentile (e.g. 99.5%) of voxels is reached is collected as well. This second intensity value may represent the dominant brain tissue intensity. Normalization may then be accomplished by linear remapping from these two collected intensity points to two standardized intensity values. For example, these two intensity values may be 30 and 500, respectively, but this choice may be different.

The histogram normalization approach therefore analyzes a histogram representation of each image, identifies peaks that are likely to represent the various tissues within the image (e.g., background, muscle, and brain) and then normalize the image to desired levels for each tissue type. This approach may be more effective than simply normalizing an image about an average pixel value, as discussed above.

Segmentation of the image may include a step of head mask determination, in which a mask of the head region is sought to identify whether each image voxel is either belonging to the head or the external space (e.g. air). The image head mask may then be used to remove the external space voxels from consideration so that the trained classifiers are not applied to the voxels pertaining to the external space. The location of the head in the volume may be described as the region not labeled as background (e.g. air). The head mask may be determined by thresholding the normalized UTE image volumes and using morphological methods to remove noise due to stray intensity patches such as those that may be caused by noise sources or artifacts. After the normalized UTE volumes have had a threshold applied, morphological closure operations (e.g. closing algorithms) may be performed to remove small gaps. Finally, region labeling may be used to detect small unconnected regions which may then be relabeled as background. In this way, the head mask may be determined. A separate head mask may be determined for each of the UTE1 and UTE2 image volumes.

The low echo time UTE1 scan may have blurring artifacts due to the nature of the UTE protocol used. Accordingly, segmentation of the bone tissue may also include a step of blur detection and removal. To remove the blur region, the outer region of the UTE volume, for example, as defined by the UTE1 head mask, may be eroded slightly via morphological methods. The eroded UTE1 head mask may then be compared with the UTE2 head mask. The blur region may then be defined as that part of the eroded UTE1 region which the UTE2 head mask defines as background. This blur region may then be removed from the original UTE1 head mask to generate a final head mask. The final head mask may then be used to remove the background from the original UTE1 and UTE2 image volumes.

The bone image of the UTE volumes may be segmented from the resulting image volumes with background removed. Since bone and air may look similar within MR image data, it may be substantially easier to identify bone within head image data with air removed. However, exemplary embodiments of the present invention may also increase the effectiveness of the trained classifiers in the detection of bone by using knowledge of the location of the image voxels with relation to both the distance in from the surface of the corrected UTE1 head mask (feature 1) and the distance down from the top of the corrected UTE1 head mask (feature 2). This information is indicative of how far in from the exterior surface of the head a given image voxel is and how far down from the top of the head the given image voxel is.

These two features may be generated, for example, by convoluting the UTE1 head mask with a 3D sphere of an appropriate size. For example, a sphere with a diameter of 5.22 cm may be used, however, other sized spheres or other sphere-like shapes may be used.

The value of the first head localization feature (HLM1), representing the distance inward from the surface of the head mask, may be calculated as the convolution response of the 3D sphere with the head mask. This approach may provide a rough distance measure of how deep a voxel is within a head mask.

The value of the second head localization map feature (HLM2), representing the distance down from the top of the head, may be calculated as the distance of a voxel from an axial plane containing the top of the head. The axial plane containing the top of the head may be defined as the highest axial plane in the convoluted head mask volume that has a response equal to that of 50% of the convolution sphere. The HLM2 feature may be a signed value. It may be a positive value for voxels above the top of the head axial plane and negative for those voxels below the top of the head axial plane.

By being aware of the location of the given voxel in terms of these two measures, and by training classifiers to specialize in detecting bone for a given head location so defined, the specialized classifiers may be applied to the appropriate region of the image data to provide a more accurate bone segmentation. For example, the image volume may be divided according to features HLM1 and HLM2 and segmentation may be performed within each image division using classifiers specially trained for the respective image divisions. Alternatively, HLM1 and HLM2 may be as input features themselves for training a segmentation classifier.

A third feature may be used to assist segmentation. This feature may be defined as a difference between the normalized UTE1 and UTE2 values for each given voxel. The difference between the UTE1 and UTE2 values over all voxels may be contemplated as the UTE difference map. As bone structure will tend to have a high UTE1 response in comparison to the corresponding UTE2 response, a high UTE1-UTE2 value may be more indicative of bone for a given voxel.

The UTE difference map may be convoluted with a flat disc-shaped 3D Gaussian kernel, tested at a series of angulations. For example, the Gaussian disc may be defined with a standard deviation of 0.83 mm in the z dimension and a standard deviation of 8.33 mm in the x/y dimensions. This approach may provide an augmented response to bone-like structure. Angulations from 0 to 180 degrees may be used in two of the axes tested, for example, at 10 degree intervals. The best response from these tests for a particular voxel may be retained as the feature value for that voxel.

Figure 2:
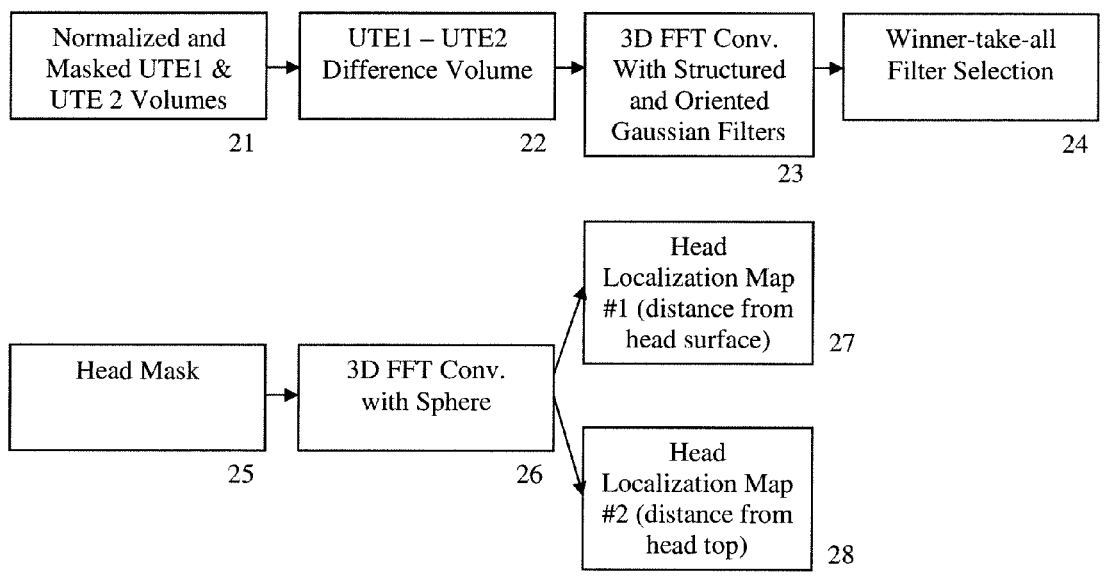
FIG. 2 a flow chart illustrating feature extraction according to exemplary embodiments of the present invention.

FIG. 2 is a flow chart illustrating feature extraction according to exemplary embodiments of the present invention. The normalized and masked UTE and UTE2 volumes 21 may be used to calculate the UTE1-UTE2 difference volume 22. A 3D object may be convoluted with the difference volume using fast Fourier transform (FFT) with structured and oriented Gaussian filters 23. A winner-take-all approach may be used to select the best response as the feature value 24. Meanwhile, the head mask 25 may be convoluted with a 3D sphere using a FFT 26. The head localization map #1 representing the distance in from the head surface 27 may be generated from the convolution result 26. The head localization map #2 representing the distance down from the head top may also be generated from the convolution result 26. One or more of these resulting three features may be used to train and/or apply the classifiers to segment the bone regions from the image volume.

Segmentation of the bone regions in step S13 may be performed using classifiers trained, for example, in accordance with an adaptive boosting algorithm. The training set used to train the classifiers may include a series of UTE1/UTE2 studies of the head along with corresponding CT scans that have been registered to serve as the ground truth. The process of training may include normalization of the UTE scans of a training set, extraction of features as described above, and training of the classifiers. A global threshold may be used to segment the bone from the CT training scans.

Figure 3:
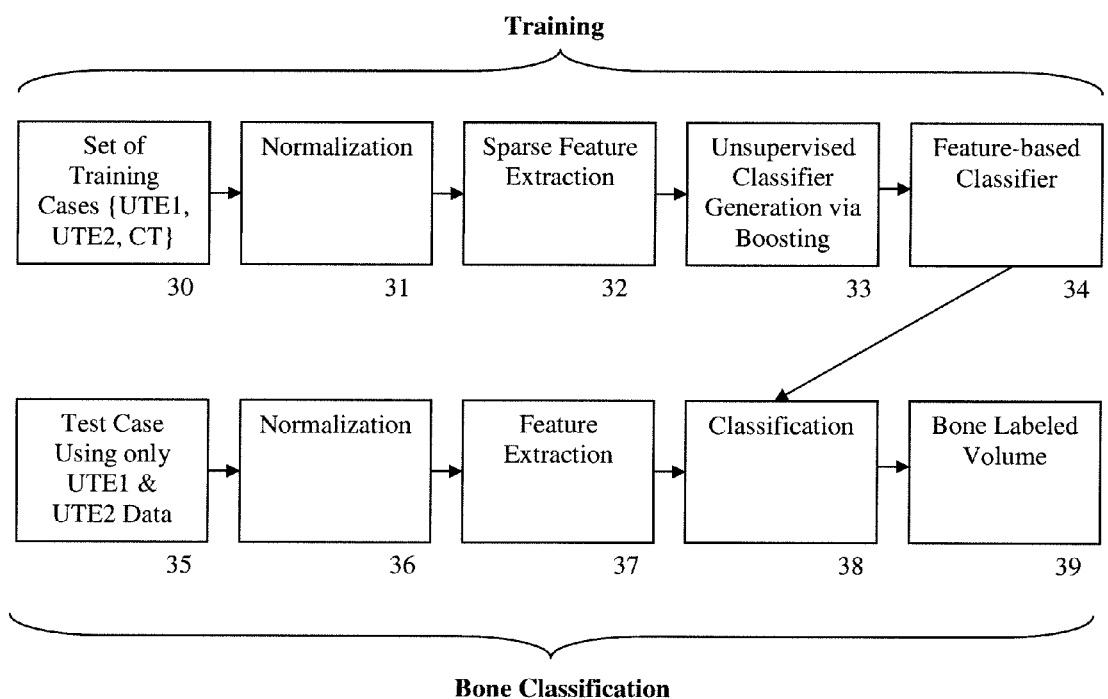
FIG. 3 is a flow chart providing a comparison of the training and classification steps according to an exemplary embodiment of the present invention.

Accordingly, many of the steps used in training are similar to the steps described above with respect to segmentation. FIG. 3 is a flow chart providing a comparison of the training and classification steps according to an exemplary embodiment of the present invention so that the similarities and differences between these two processes may be more easily understood.

In training, a set of training cases including UTE1, UTE2, and CT image data may be acquired (Step S30). The UTE1 and UTE2 images may then be normalized (Step S31). Sparse feature extraction may be performed on the acquired images (Step S32). Unsupervised classifier generation may then be performed using boosting (Step S33). Then, feature-based classifiers may be generated, for example, using simple if-then operations (Step S34). The classifiers, so trained, may then be used to classify bone regions from subsequent test data. This process may include acquiring test data including the UTE1 and UTE2 MR image volumes (Step S35). Normalization may then be performed on the acquired image volumes (Step S36). Feature extraction may be performed on the normalized images (Step S37). Bone classification may be performed using the pre-trained classifiers (Step S38). The image volume may then be labeled in accordance with the results of the bone classification (Step S39).

As described above, the results of the bone segmentation and the UTE head mask may be used to generate a pseudo-CT image (Step S14). In this step, all voxels occurring inside the head that are not classified as bone may be classified as soft tissue. All voxels outside the head mask may be classified as air. Hounsfield scale values (measured in Hounsfield units "HU") may then be assigned to each voxel of the image volume depending on whether the voxel has been designated as air, tissue, or bone. The resulting image with assigned Hounsfield scale values may be used as a pseudo CT scan, for example, to create a pseudo PET-CT result.

Figure 4:
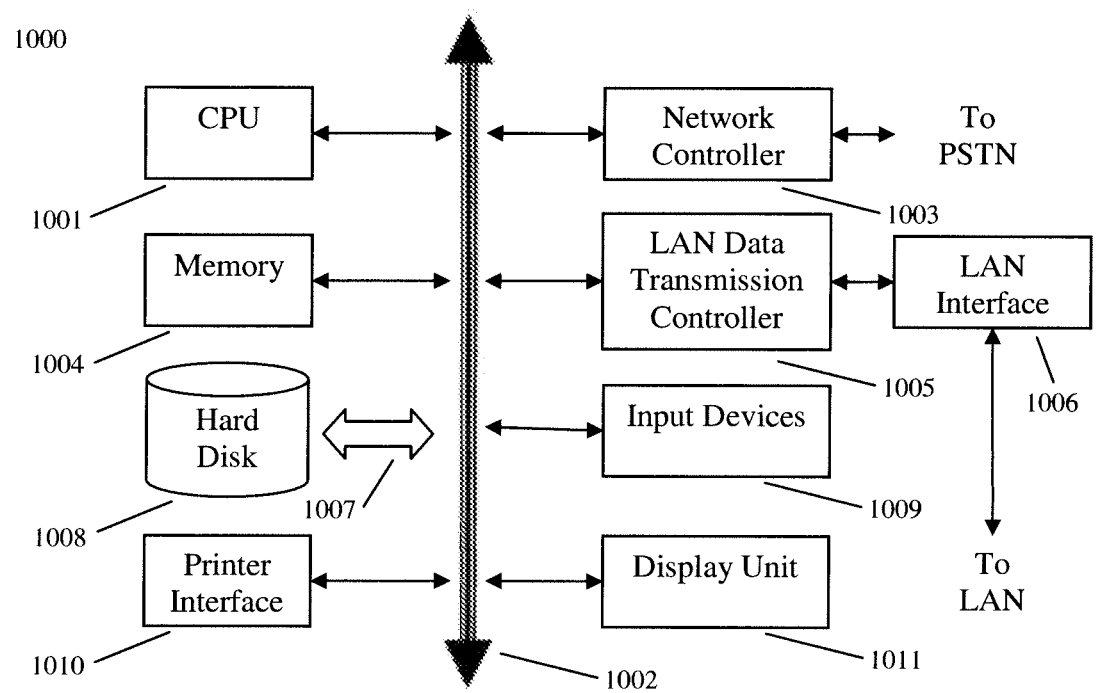
FIG. 4 shows an example of a computer system capable of implementing the method and apparatus according to embodiments of the present disclosure.

FIG. 4 shows an example of a computer system which may implement a method and system of the present disclosure, and in particular, may be used to perform image processing steps. The image processing steps of the present disclosure may be implemented in the form of a software application running on a computer system, for example, a mainframe, personal computer (PC), handheld computer, server, etc. The software application may be stored on a recording media locally accessible by the computer system and accessible via a hard wired or wireless connection to a network, for example, a local area network, or the Internet.

The computer system referred to generally as system 1000 may include, for example, a central processing unit (CPU) 1001, random access memory (RAM) 1004, a printer interface 1010, a display unit 1011, a local area network (LAN) data transmission controller 1005, a LAN interface 1006, a network controller 1003, an internal bus 1002, and one or more input devices 1009, for example, a keyboard, mouse etc. As shown, the system 1000 may be connected to a data storage device, for example, a hard disk, 1008 via a link 1007.

The image acquisition steps may be performed using MR, CT, and PET scanners, as described in detail above. Resulting processed images may be displayed on the display unit 1011 of the computer system 1000 or on a separate display unit or printer.

Exemplary embodiments described herein are illustrative, and many variations can be introduced without departing from the spirit of the disclosure or from the scope of the appended claims. For example, elements and/or features of different exemplary embodiments may be combined with each other and/or substituted for each other within the scope of this disclosure and appended claims.

What is claimed is:

1. A method for generating a pseudo-computed tomography (CT) image volume, comprising:
    acquiring a first magnetic resonance (MR) image volume (UTE1) using an ultra-short echo time within a range of from 0 to 100 ms;
    acquiring a second MR image volume (UTE2) using a conventional echo time that is longer than 100 ms;
    normalizing the acquired UTE1 and UTE2 image volumes;
    creating a first mask for an anatomical structure featured in the normalized UTE1 image volume and creating a second mask for the anatomical structure featured in the normalized UTE2 image volume;
    segmenting bone regions from the normalized UTE1 and UTE2 image volumes using the created first and second masks and one or more trained classifiers; and
    constructing a pseudo-CT image from the normalized UTE1 and UTE2 image volumes, the created first and second masks, and the segmented bone regions.

2. The method of claim 1, wherein the anatomical structure is a head.

3. The method of claim 1, wherein the first MR image volume UTE1 and the second MR image volume UTE2 are acquired using a single UTE MR protocol.

4. The method of claim 1, wherein the acquired UTE1 and UTE2 image volumes are normalized to standardize intensity spreads between a main background region and a foreground region.

5. The method of claim 1, wherein normalization of the acquired UTE1 and UTE2 image volumes includes histogramming the UTE1 and UTE2 image volumes and identifying a first intensity value at a first major peak attributable to a background region and a second intensity value attributable a second major peak attributable to a foreground region and performing linear remapping on the UTE1 and UTE2 images to normalize the first and second intensity values.

6. The method of claim 1, wherein creating the mask first and second masks of the anatomical structure includes:
    thresholding the normalized UTE1 and UTE2 image volumes;
    using morphological methods to remove noise due to stray intensity patches;
    applying a morphological closing operation to remove small gaps; and
    performing region labeling to detect small unconnected regions which are then labeled as background.

7. The method of claim 1, wherein the one or more trained classifiers use features based on one or more of the following:
    a difference between the normalized UTE1 and UTE2 image volumes;
    a first localization map proving voxel distance inward from an outer surface of the anatomical structure; and
    a second localization map providing voxel distance downward from a top plane of the anatomical structure.

8. The method of claim 1, wherein the one or more trained classifiers are trained using training data including:
    UTE1 image volumes;
    UTE2 image volumes; and
    corresponding CT scans that have been registered to serve as ground truth.

9. The method of claim 8, wherein training the trained classifiers includes normalizing the UTE1 and UTE2 image volumes and extracting classifier features.

10. The method of claim 9, wherein extracting classifier features includes:
    calculating a difference between the normalized UTE1 and UTE image volumes;
    generating a first localization map providing voxel distance inward from an outer surface of the anatomical structure; and
    generating a second localization map providing voxel distance downward from a top plane of the anatomical structure.

11. The method of claim 1, wherein constructing the pseudo-CT image includes assigning appropriate Hounsfield scale values based on the anatomical map and the segmented bone regions.

12. The method of claim 1, additionally including:
    acquiring a positron emission tomography (PET) scan;
    generating an approximate attenuation correction (AC) map based on the constructed pseudo-CT image; and
    calibrating an intensity of the PET result using the generated AC map.

13. A method for generating a pseudo-computed tomography (CT) image volume, comprising:
    acquiring a set of training data including a first magnetic resonance (MR) image volume (UTE1) acquired using an ultra-short echo time within a range of from 0 to 100 ms, a second MR image volume (UTE2) acquired using a conventional echo time that is longer than 100 ms, and corresponding reference CT images;
    normalizing the UTE1 and UTE2 images of the training data;
    extracting one or more features from the normalized UTE1 and UTE2 images of the training data;

training one or more classifiers based on the normalized UTE1 and UTE2 images of the training data and the one or more extracted features;

acquiring test case data including UTE1 and UTE2 images;

normalizing the acquired UTE1 and UTE2 images of the test case data;

creating a first mask for an anatomical structure featured in the normalized UTE1 image of the test case data and creating a second mask for the anatomical structure feature in the normalized UTE2 image of the test case data;

segmenting bone regions from the normalized UTE1 and UTE2 images of the test case data using the created mask and one or more trained classifiers; and constructing a pseudo-CT image from the normalized UTE1 and UTE2 images of the test case data, the created first and second masks, and the segmented bone regions.

14. The method of claim 13, wherein normalization of the acquired UTE1 and UTE2 image volumes of the training data and the test data includes histogramming the UTE1 and UTE2 image volumes and identifying a first intensity value at a first major peak attributable to a background region and a second intensity value attributable a second major peak attributable to a foreground region and performing linear remapping on the UTE1 and UTE2 images to normalize the first and second intensity values.

15. The method of claim 13, wherein the features extracted from the normalized UTE1 and UTE2 images of the training data are based on one or more of the following:

a difference between the normalized UTE1 and UTE2 images of the training data;

a first localization map proving voxel distance inward from an outer surface of the anatomical structure; and a second localization map providing voxel distance downward from a top plane of the anatomical structure.

16. A method for generating a pseudo-computed tomography (CT) image volume, comprising:

acquiring a first magnetic resonance (MR) image volume (UTE1) of a head using an ultra-short echo time within a range of from 0 to 100 ms;

acquiring a second MR image volume (UTE2) of the head using a conventional echo time that is longer than 100 ms;

normalizing the acquired UTE1 and UTE2 image volumes;

creating a first head mask in the normalized UTE1 image volume and creating a second head mask in the normalized UTE2 image volume;

segmenting bone regions from the normalized UTE1 and UTE2 image volumes using the created first and second head masks and one or more trained classifiers; and constructing a pseudo-CT image from the normalized UTE1 and UTE2 image volumes, the created first and second head masks, and the segmented bone regions.

17. The method of claim 16, wherein constructing the pseudo-CT image includes:

assigning a first Hounsfield scale value to the segmented bone regions;

assigning a second Hounsfield scale value to air regions determined using the head map; and assigning a third Hounsfield scale value to brain regions determined using the normalized UTE2 image volume.

18. A computer system comprising: a processor; and a non-transitory, tangible, program storage medium, readable by the computer system, embodying a program of instructions executable by the processor to perform method steps for generating a medical image, the method comprising:

acquiring a first magnetic resonance (MR) image volume (UTE1) using an ultra-short echo time within a range of from 0 to 100 ms;

acquiring a second MR image volume (UTE2) using a conventional echo time that is longer than 100 ms;

normalizing the acquired UTE1 and UTE2 image volumes;

segmenting bone regions from the normalized UTE1 and UTE2 image volumes, a first segmentation mask produced from the UTE1 image, a second segmentation mask produced from the UTE2 image, and one or more trained classifiers; and constructing a pseudo-CT image by assigning appropriate Hounsfield scale values based on the normalized UTE1 and UTE2 image volumes and segmented bone regions.

19. The computer system of claim 18, wherein the anatomical structure is a head and the first and second segmentation masks are created from the normalized UTE1 and UTE2 image volumes, respectively, and the generated first and second head masks are used in segmenting the bone region and constructing the pseudo-CT image.

20. The method of claim 18, wherein the one or more trained classifiers are trained using:

training data including UTE1 image volumes, UTE2 image volumes, and corresponding CT scans that have been registered to serve as ground truth; and features based on one or more of the following: a difference between the normalized UTE1 and UTE2 image volumes, a first localization map proving voxel distance inward from an outer surface of the anatomical structure, and a second localization map providing voxel distance downward from a top plane of the anatomical structure.

* * * * *